United States Patent
Niira et al.

(10) Patent No.: US 8,455,754 B2
(45) Date of Patent: Jun. 4, 2013

(54) SOLAR CELL ELEMENT MANUFACTURING METHOD AND SOLAR CELL ELEMENT

(75) Inventors: Koichiro Niira, Shiga (JP); Manabu Komoda, Shiga (JP)

(73) Assignee: KYOCERA Corporation, Kyoto (JP)

( * ) Notice: Subject to any disclaimer, the term of this patent is extended or adjusted under 35 U.S.C. 154(b) by 467 days.

(21) Appl. No.: 12/430,631

(22) Filed: Apr. 27, 2009

(65) Prior Publication Data

US 2009/0223562 A1 Sep. 10, 2009

Related U.S. Application Data

(63) Continuation-in-part of application No. PCT/JP2007/071026, filed on Oct. 29, 2007.

(30) Foreign Application Priority Data

Oct. 27, 2006 (JP) .................................. 2006-292995

(51) Int. Cl.
*H01L 31/00* (2006.01)
*H01L 21/00* (2006.01)

(52) U.S. Cl.
USPC ........... 136/256; 136/255; 136/258; 136/261; 257/E31.124; 438/57; 438/61; 438/96; 438/97; 438/98

(58) Field of Classification Search
USPC .......... 136/255, 256, 258, 261; 257/E31.124; 438/57, 61, 96, 97, 98
See application file for complete search history.

(56) References Cited

U.S. PATENT DOCUMENTS

| | | | | |
|---|---|---|---|---|
| 5,428,249 A | * | 6/1995 | Sawayama et al. | 136/256 |
| 5,641,362 A | | 6/1997 | Meier | |
| 6,091,019 A | * | 7/2000 | Sakata et al. | 136/256 |
| 6,551,903 B1 | * | 4/2003 | Shi et al. | 438/434 |
| 2003/0092226 A1 | | 5/2003 | Nagashima et al. | |
| 2004/0200520 A1 | * | 10/2004 | Mulligan et al. | 136/256 |
| 2006/0130891 A1 | * | 6/2006 | Carlson | 136/256 |

FOREIGN PATENT DOCUMENTS

| | | |
|---|---|---|
| JP | 05-259488 | 10/1993 |
| JP | 08-274356 | 10/1996 |
| JP | 2000-332279 | 11/2000 |
| JP | 2001-267610 | 9/2001 |
| JP | 2003-124483 | 4/2003 |
| JP | 2003-173980 | 6/2003 |
| JP | 2006-080450 | 3/2006 |

OTHER PUBLICATIONS

Matsukuma et al JP05-259488 English translation.*

(Continued)

*Primary Examiner* — Jonathan Johnson
*Assistant Examiner* — Andrew Golden
(74) *Attorney, Agent, or Firm* — Procopio, Cory, Hargreaves & Savitch LLP

(57) ABSTRACT

A solar cell element and method of manufacturing same is disclosed. A reverse-conductive-type layer is formed on at least one part of a first surface side of a one-conductive-type semiconductor substrate. A conductive layer is formed on the reverse-conductive-type layer. A contact region for electrically connecting the conductive layer and the one-conductive-type semiconductor substrate is formed by heating and melting at least one part of the conductive layer. The solar cell element can be manufactured without conducting complicated treatments, such as removal by etching and re-growing of a silicon thin layer.

16 Claims, 11 Drawing Sheets

OTHER PUBLICATIONS

P.J. Verlinden, R.M. Swanson, R.A. Crane, K. Wickham and J. Perkins, A 28.8% Efficient Concentrator Point-Contact Solar Cell, 13th European Photovoltaic Energy Conference, Oct. 23-27, 1995, Nice France, pp. 1582-1585.

Ajeet Rohatgi, Designs and Fabrication Technologies for Future Commercial Crystalline Si Solar Cells, University Center of Excellence for Photovoltaics Research and Education, School of Electric and Computer Engineering, Georgia Institute of Technology, Atlanta, GA, pp. 11-22.

S.W. Glunz, E. Schneiderochner, D. Kray, A. Grohe, M. Hermle, H. Kampworth, R. Preu, G. Willeke, Laser-Fired Contact Silicon Solar Cells on p- and n-Substrates, 19th European Photovoltaic Conference, Jun. 7-11, 2004, Paris France, pp. 408-411.

* cited by examiner (a)

(b)

(c)

(a)

(b)

Table 1

| | Basic structure | Surface structure | Rear surface electrode structure | Other variation | Jsc [mA/cm$^2$] | Conversion efficiency [%] |
|---|---|---|---|---|---|---|
| Comparative Example | Back contact structure (heterojunction) | ITO film/flat structure | TCO/Al | | 30.7 | 14.2 |
| Example 1 | Back contact structure (heterojunction/laser ablation contact) | ITO film/flat structure | TCO/Al | | 30.9 | 14.3 |
| Example 2 | The same as in Example 1 | ITO film/RIE uneven structure | TCO/Al | | 34.4 | 15.9 |
| Example 3 | The same as in Example 1 | ITO film/a-Si:H/H/RIE uneven structure | TCO/Al | | 37.5 | 17.4 |
| Example 4 | The same as in Example 1 | ITO film/a-Si:H/H/RIE uneven structure | TCO/Ag/Al | | 38.2 | 17.9 |
| Example 5 | The same as in Example 1 | ITO film/a-Si:H/H/RIE uneven structure | TCO/Ag/Al | Before the formation of a heterojunction, local formation of a p$^+$ region in the substrate rear surface by Al-printing. | 38.4 | 17.9 |
| Example 6 | The same as in Example 1 | ITO film/a-Si:H/H/RIE uneven structure | TCO/Ag/Al | Before the formation of a TCO layer, removal of the silicon thin layer positioned in the positive electrode region by laser. | 38.2 | 17.8 |
| Example 7 | The same as in Example 1 | ITO film/a-Si:H/H/RIE uneven structure | TCO/Ag/Al | Before the formation of an Al layer, removal of the silicon thin layer/TCO layer/Ag layer positioned in the positive electrode region by laser. | 38.3 | 17.9 |

FIGURE 11

SOLAR CELL ELEMENT MANUFACTURING METHOD AND SOLAR CELL ELEMENT

CROSS-REFERENCE TO RELATED APPLICATION

This application is a continuation in part based on PCT Application PCT/JP2007/071062, filed on Oct. 29, 2007, which claims the benefit of Japanese National Application No. JP2006-292995, filed on Oct. 27, 2006, the content of which are incorporated by reference herein in their entirety.

FIELD OF INVENTION

Embodiments of the present disclosure relate generally to solar energy, and more particularly relate to solar cells.

BACKGROUND OF THE INVENTION

Current solar cell elements with a crystal silicon substrate often use an element having front electrodes made of metal on their light-receiving surface sides. The front electrodes are usually metallic electrodes called bus bars or fingers. The current solar cell elements with the crystal silicon substrate also often use back contact (BC) type solar cell elements. Both positive and negative electrodes are arranged on a non-light-receiving surface side of the BC type solar cell element without arranging the front electrodes on the light-receiving surface side. An amorphous silicon film may be arranged on the rear surface side of a silicon substrate.

For a solar cell element having a p-type substrate, it is generally preferred to locate an n/p/p+ junction between the positive and the negative electrodes. For the BC type solar cell elements, it is preferred to locate such an n/p/p+ junction between the positive and the negative electrodes arranged on the same surface side of their substrate.

The formation of the n/p/p+ junction structure is realized through two film-forming steps: a first vacuum-film-forming step, and a second vacuum-film-forming step. The first vacuum-film-forming step is a step of forming a first silicon thin layer containing an n-type silicon thin film layer. The second vacuum-film-forming step is a step of forming a second silicon thin layer containing a p-type silicon thin film layer. However, it is necessary to have at least one mask forming step, and then pattern etching in order to form each of the layers. Fewer or simpler steps would reduce costs. Therefore, there is a need for a simpler method for manufacturing a solar cell element.

SUMMARY

A solar cell element and method of manufacturing same is disclosed. A reverse-conductive-type layer is formed on at least one part of a first surface side of a one-conductive-type semiconductor substrate. A conductive layer is formed on the reverse-conductive-type layer. A contact region for electrically connecting the conductive layer and the one-conductive-type semiconductor substrate is formed by heating and melting at least one part of the conductive layer. In this manner, the solar cell element can be manufactured without conducting complicated treatments, such as removal by etching and re-growing of a silicon thin layer.

A first embodiment comprises a method of manufacturing a solar cell element. The method comprises forming a reverse-conductive-type layer on at least one part of a first surface side of a one-conductive-type semiconductor substrate. The method further comprises forming a conductive layer on the reverse-conductive-type layer. The method also comprises forming a contact region by heating and melting at least one part of the conductive layer, thereby for electrically connecting the conductive layer and the one-conductive-type semiconductor substrate.

A second embodiment comprises a solar cell element. The solar cell element comprises a one-conductive-type semiconductor substrate, and a first electrode section comprising a reverse-conductive-type layer of a reverse-conductive-type and a first conductive layer that are successively laminated on a first surface of the one-conductive-type semiconductor substrate. The solar cell element further comprises a second electrode section comprising a contact region comprising a doping element of the reverse-conductive-type and a second conductive layer that are successively laminated on a diffusion region. The diffusion region is a part of a first surface side of the one-conductive-type semiconductor substrate and comprises constituting elements of the contact region.

BRIEF DESCRIPTION OF THE DRAWINGS

Embodiments of the present disclosure are hereinafter described in conjunction with the following figures, wherein like numerals denote like elements. The figures are provided for illustration and depict exemplary embodiments of the disclosure. The figures are provided to facilitate understanding of the disclosure without limiting the breadth, scope, scale, or applicability of the disclosure. The drawings are not necessarily made to scale.

FIG. 11 illustrates a table of parameters of exemplary solar cell elements manufactured according to various embodiments of the disclosure.

DETAILED DESCRIPTION OF EXEMPLARY EMBODIMENTS

The following description is presented to enable a person of ordinary skill in the art to make and use the embodiments of the disclosure. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the invention. Thus, embodiments of the present disclosure are not intended to be limited to the examples described herein and shown, but are to be accorded a scope consistent with the claims.

Embodiments of the disclosure are described herein in the context of a practical non-limiting application, namely, solar cells. Embodiments of the disclosure, however, are not limited to such solar cell applications, and the techniques described herein may also be utilized for other applications. For example, embodiments may be applicable to photoelectric converters and the like.

In the following description of exemplary embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the present disclosure. For the sake of brevity, conventional techniques and components related to a solar cell element and forming same, functional aspects of manufacturing same, and the individual operating components of manufacturing devices may not be described in detail herein. In this document, the expression "aEn" represents a×10$^n$ (i.e., E-notation).

Figure 1:
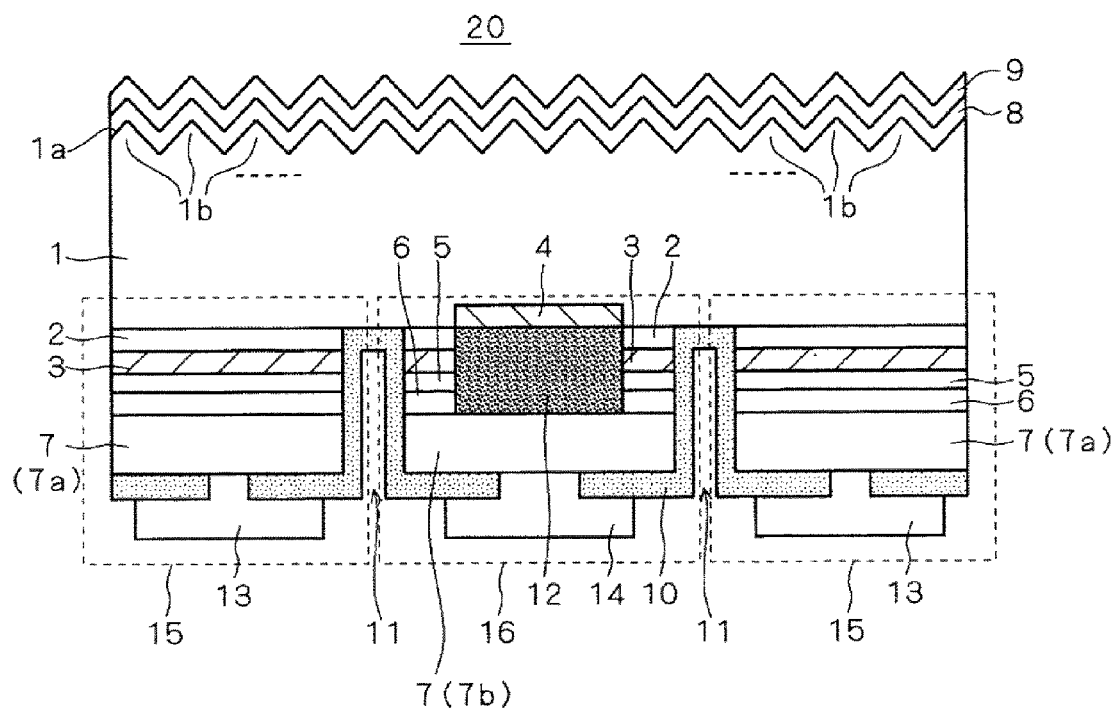
FIG. 1 illustrates a schematic sectional view showing an exemplary structure of a solar cell element according to an embodiment of the disclosure.
Figure 2:
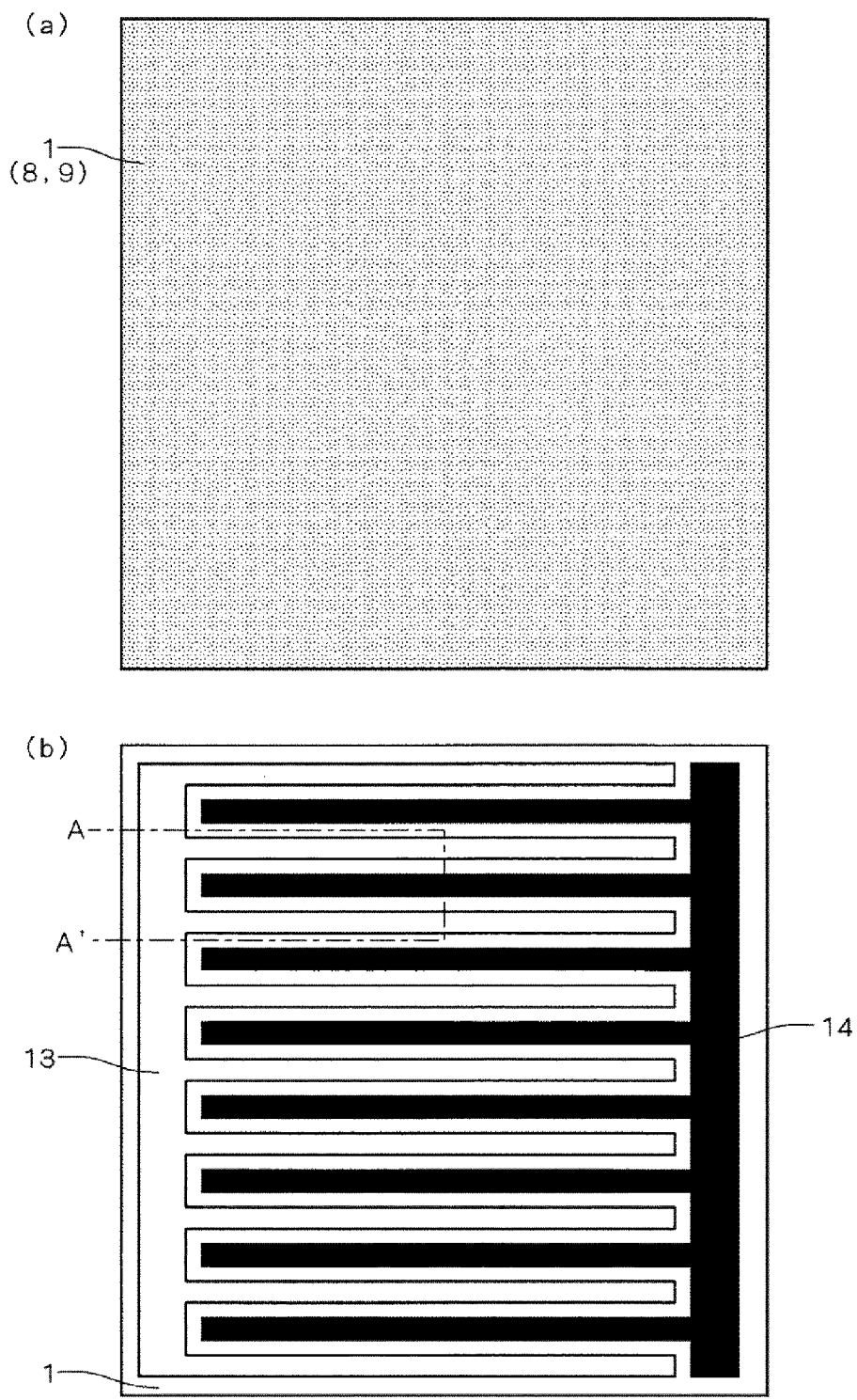
FIG. 2A illustrates a top view of an exemplary front surface side (light-receiving surface) view of the solar cell element according to an embodiment of the disclosure.
FIG. 2B illustrates top view of exemplary leading-out electrodes arranged on a rear surface (non-light-receiving surface) side of the solar cell element according to an embodiment of the disclosure.

FIG. 1 illustrates a schematic sectional view showing an exemplary structure of a solar cell element 20 according to an embodiment of the disclosure. FIGS. 2A and 2B show a top view of the front surface (light-receiving surface) side and the rear surface (non-light-receiving surface) side of the solar cell element 20 respectively. FIG. 2A is a view of the solar cell element 20 when it is viewed from the front surface (light-receiving surface) side thereof and FIG. 2B is a simplified view illustrating leading-out electrodes arranged on the solar cell element 20 as viewed from the rear surface (non-light-receiving surface) side. A cross section taken on line A-A' of FIG. 2B corresponds to FIG. 1.

The structure of a solar cell element 20 according to an embodiment of the present disclosure is described first. The solar cell element 20 is a BC type solar cell element (BC type solar cell element 20) having no electrode on the front (light-receiving) surface side, but has a negative electrode and a positive electrode on the rear (non-light-receiving) surface side.

The BC type solar cell element 20 comprises layers laminated and formed on each of both the light-receiving surface side and the non-light-receiving surface side of a semiconductor substrate 1. The semiconductor substrate 1 may be, for example but without limitation, a one-conductive-type (e.g., a p-type) crystal silicon substrate, such as a monocrystal silicon substrate or polycrystal silicon substrate containing a predetermined dopant element (impurity for conductive-type-control), a plate-form silicon substrate yielded by the crystal pulling method such as the ribbon method, and the like. The thickness of the semiconductor substrate 1 is preferably about 300 μm or less, more preferably about 250 μm or less, even more preferably about 150 μm or less.

The present embodiment will be described below, using a p-type crystal silicon substrate as the semiconductor substrate 1. When the semiconductor substrate 1 is a p-type crystal silicon substrate, it is preferred to use, for example, boron (B) or gallium (Ga) as a dopant element. The use of Ga is preferred for making the solar cell element 20 have high efficiency since a light-induced degradation phenomenon can be avoided. The light-induced degradation phenomenon may be generated because when B is used, oxygen (O) and B in the semiconductor substrate 1 interact with each other.

On the light-receiving surface side (upper (front) surface side in FIG. 1) of the semiconductor substrate 1, a texture structure (uneven structure) 1a, a passivation layer 8 and an antireflective layer 9 are successively formed. These structures are optionally formed if necessary.

The texture structure 1a (uneven structure) is configured to decrease the reflectivity of incident light on the light-receiving surface of the semiconductor substrate 1. The light-receiving surface side of the semiconductor substrate 1 is rendered an uneven surface having numerous fine projections 1b. It is preferred that the width and the height of the projections 1b are each about 2 μm or less and the aspect ratio (i.e., height/width) is about 0.1 or more and about 2 or less.

The passivation layer 8 is configured to realize the so-called passivation effect, and is formed on the uneven surface based on the texture structure 1a. The passivation layer 8 is preferably formed as a hydrogenated amorphous silicon (a-Si:H) film or a hydrogenated microcrystal silicon (μc-Si: H) film. The phrase "microcrystal silicon" represents a substance in a state that amorphous silicon is embedded in crystal grain boundaries between crystal silicon grains. The passivation layer 8 is formed preferably into a thickness of about 0.5 nm to about 5 nm. The formation of the a-Si:H film or the μc-Si:H film is classified into the formation of an i-type film, which is not doped with any impurity, and the formation of a p-type or n-type film, which is doped with an impurity.

The antireflective layer 9 is configured to restrain reflection of incident light on the light-receiving surface of the semiconductor substrate 1, and is formed on the passivation layer 8. The antireflective layer 9 is preferably formed as a silicon nitride film (SiN$_x$ film, wherein the composition ratio, which depends on x, is varied from the center of the Si$_3$N$_4$ stoichiometry), an oxide material film (such as a TiO$_2$ film, SiO$_2$ film, MgO film, ITO film, SnO$_2$ film or ZnO film), or the like. A preferred value of the thickness of the antireflective film 9 is varied in accordance with the material used for the antireflective film 9. The thickness of the antireflective film 9 is set to a value permitting conditions for non-reflection of incident light to be realized. More specifically, when a refractive index of the material used in the antireflective film 9 is represented by n and the wavelength of light to be made non-reflective is represented by λ, the optimal film thickness d of the antireflective layer 9 is represented by (λ/n)/4. In a case where the antireflective layer 9 is formed as a SiN$_x$ film (n is about 2), which is generally used, the thickness of the antireflective layer 9 is preferably about 75 nm when the wavelength of light to be made non-reflective is about 600 nm based on the sunlight spectral characteristics. When a surface passivation effect is in the film that constitutes the antireflective layer 9, the formation of the passivation layer 8 may be omitted.

A negative electrode section 15 and a positive electrode section 16 are formed on the non-light-receiving surface side (lower (rear) surface side in FIG. 1) of the semiconductor substrate 1. Specifically, the negative electrode section 15 and the positive electrode section 16 are made in a form of a laminate structure (hereinafter, also referred to as a laminate) made up of an intrinsic (i-type) silicon thin layer 2, an n-type silicon thin layer 3 (reverse-conductive-type layer), a transparent conductive adhesive layer 5 (TCO film), a reflective layer 6 and a conductive layer 7. The laminate is separated into a plurality of moieties (which may be referred to as partial laminates) by removing at least one part of the laminate to form electrode separators 11. The electrode separators 11 are trenches (separating trenches) for electrically separating the negative electrode section 15 and the positive electrode section 16 (the partial laminates that comprise the sections 15 and 16, respectively) from each other. The laminate is separated, for example but without limitation, by radiating a laser ray to the laminate.

The i-type silicon thin layer 2 is preferably formed into a thickness of about 0.5 nm to about 5 nm, as an i-type a-Si:H film (a-Si:H (i) film) or i-type microcrystal silicon thin film (μc-Si:H(i) film), on the non-light-receiving surface of the semiconductor substrate 1.

The n-type silicon thin layer 3 is preferably formed into a thickness of about 2 nm to about 20 nm, as an n-type a-Si:H film (a-Si:H (n) film) or n-type microcrystal silicon film (μc-Si:H(n) film) doped with, for example, P (phosphorus) as a dopant, on the i-type silicon thin layer 2.

In this manner, the p-type crystal silicon substrate 1 (semiconductor substrate 1), the i-type silicon thin layer 2 and the n-type silicon thin layer 3 form a so-called heterojunction (pin junction). However, the i-type silicon thin layer 2 is optional, and a pn junction may be formed by forming the n-type silicon thin layer 3 directly onto the non-light-receiving surface of the p-type crystal silicon substrate 1. Hereinafter, the i-type silicon thin layer 2 and the n-type silicon thin layer 3 together may be referred to as a silicon thin layer.

The transparent conductive adhesive layer 5 is configured to increase the adhesion strength between the silicon thin layer and the conductive layer 7, and may be optionally formed. The transparent conductive adhesive layer 5 is preferably, for example but without limitation, an ITO film, a SnO$_2$ film or a ZnO film, and the like. The thickness of the transparent conductive adhesive layer 5 is preferably from about 1 nm to about 10 nm.

The reflective layer 6 is configured to reflect a light component transmitted through the semiconductor substrate 1 from incident light rays radiated into the solar cell element from the light-receiving surface side. For example, the reflective layer 6 reflects long-wavelength light rays comprising wavelengths of about 900 nm and more, and then radiates the light component into the semiconductor substrate 1. The reflective layer 6 may be optionally formed. The formation of the reflective layer 6 makes it possible to make the amount of light rays taken-in larger to improve characteristics of the solar cell element 20. The reflective layer 6 is preferably a silver (Ag) film made mainly of Ag. However, the material of the reflective layer 6 is not limited to Ag. Any material may be used that has a light reflectivity to the above-mentioned long-wavelength light rays similar to that of Ag. The thickness of the reflective layer 6 is preferably from about 1 nm to about 10 nm.

When the reflective layer 6 is located between the silicon thin layer and the conductive layer 7, the effects and advantages thereof are produced. However, as illustrated in FIG. 1, when the transparent conductive adhesive layer 5 is located between the silicon thin layer and the conductive layer 7, it is more preferred to arrange the reflective layer 6 between the transparent conductive adhesive layer 5 and the conductive layer 7.

The conductive layer 7 is configured to cause the negative electrode section 15 to function as a negative electrode and to cause the positive electrode section 16 to function as a positive electrode. The conductive layer 7 is, for example and without limitation, a layer (Al layer) made mainly of aluminum (Al). The conductive layer 7 comprises a first conductive layer 7a comprising the negative electrode section 15 and a second conductive layer 7b comprising the positive electrode section 16. The thickness of the conductive layer 7 is preferably from about 100 nm to about 5000 nm.

Additionally, an insulating layer 10 is configured to cover the conductive layer 7 and the electrode separators 11. The insulating layer 10 is formed in an external surface region of the non-light-receiving surface side of the semiconductor substrate 1, and extends to the negative electrode section 15 and the positive electrode section 16. The insulating layer 10 also leaves one portion of each of the first and second conductive layers 7a and 7b naked. The insulating layer 10 is preferably made of an oxide or a nitride. When the insulating layer 10 is made of, in particular, SiO$_2$ film or TiO$_2$ film, the insulating layer 10 can also produce advantageous effects as a passivation layer.

The first electrode (negative charge (−) leading-out electrode) 13 and the second electrode (positive charge (+) leading-out electrode) 14 are formed in the negative electrode section 15 and the positive electrode section 16 respectively. The first electrode 13 and the second electrode 14 are configured to electrically connect the solar cell element 20 to an external wiring. If necessary, solder regions may be formed on the first electrode 13 and the second electrode 14.

In the embodiment shown in FIG. 1, the solar cell element 20 comprises two pieces of the negative electrode section 15 and one piece of the positive electrode section 16. In practice, however, each of the first electrode 13 and the second electrode 14 of the solar cell element 20 is formed according to the embodiment shown in FIG. 2B. In this embodiment each of the first electrode 13 and the second electrode 14 is formed as a so-called comb-tooth form electrode, which is made up of a first linear portion and a plurality of second linear portions connected to the first linear portion, and separated from each other. Detailed illustration is not given in FIG. 2B. The negative electrode section 15 and the positive electrode section 16 are formed so as to correspond to the electrode arrangement shown in FIG. 2B by arranging the electrode separators 11 accordingly. In other words, FIG. 1 corresponds to a view which partially and schematically illustrates a sectional structure of a region where the individual electrode fingers (second linear portions) of the first and second electrodes 13 and 14 shown in FIG. 2B are arranged alternately.

In the embodiment shown in FIG. 1, a contact region 12 is made in at least one portion of the positive electrode section 16. The contact region 12 penetrates through the i-type silicon thin layer 2, and the n-type silicon thin layer 3, the transparent conductive adhesive layer 5 and the reflective layer 6. In other words, the contact region 12 penetrates through a region which is combined with the semiconductor substrate 1 to form a heterojunction. The contact region 12 connects the semiconductor substrate 1 electrically to the second conductive layer 7b.

The contact region 12 is made by heating and melting the second conductive layer 7b formed over the n-type silicon thin layer 3 (or combined with the n-type silicon thin layer 3 to sandwich the transparent conductive adhesive layer 5 and the reflective layer 6), as described in more detail below. Therefore, the contact region 12 is made mainly of Al, which is the constituting element (doping element) of the second conductive layer 7b (second electrode section) or one of the constituting elements thereof.

As a result of the above-mentioned heating and melting, a region (p+ region 4) that is one portion of the crystal silicon substrate 1 (semiconductor substrate 1) and is positioned near the contact region 12 contains Al atoms originating from the second conductive layer 7b in an amount of, for example, about 1E18 to 5E18 atoms/cm$^3$. Al functions as a p-type doping element in Si; thus, the region (p+ region 4) functions as a p+ region 4. When the contact region 12 is made using a laser melting contact process, the p+ region 4 is made to extend from the rear surface side of the semiconductor substrate 1 into a depth of several micrometers although the size of the p+ region 4 depending on the thickness of the second conductive layer 7b.

The solar cell element 20 according to the embodiment shown FIG. 1 is a BC type solar cell element (BC type solar cell element 20) wherein an n/p/p+ junction is formed between the first conductive layer 7a of the negative electrode section 15 and the second conductive layer 7b of the positive electrode section 16, which are each arranged on the rear surface side, (and the contact region 12) by means of the n-type silicon thin layer 3, the semiconductor substrate 1, and the p+ region 4, which is one portion thereof. Since this BC type solar cell element 20 comprises a p/p+ junction (the so-called high-low junction), a potential barrier is formed against electrons that are a minority carrier generated by irradiation with light in the semiconductor substrate 1, so as to produce the so-called BSF effect, that is, an effect of restraining a matter that the electrons reach the interface between silicon and the positive electrode so as to be extinguished by recombination.

Figure 4:
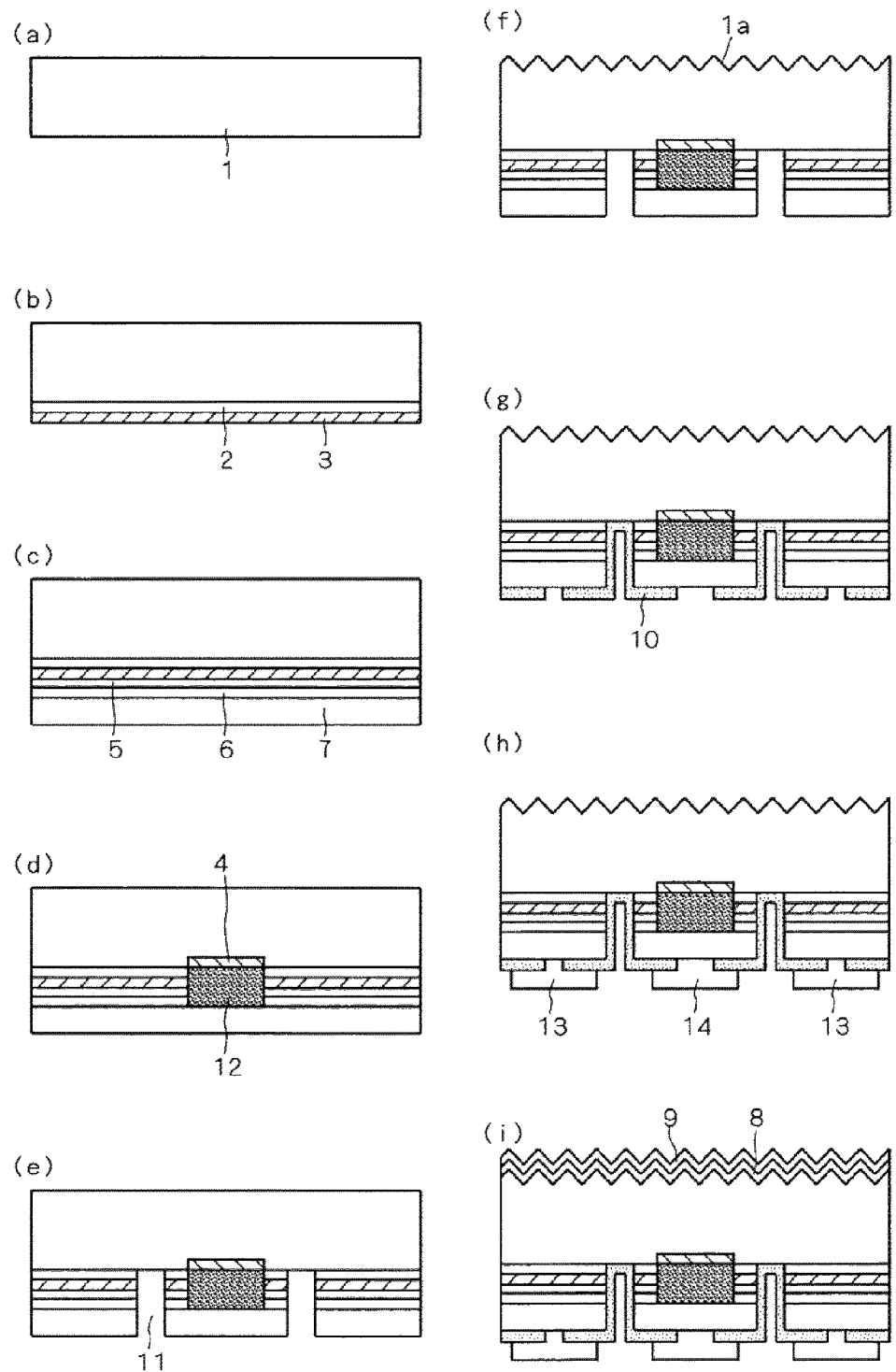
FIGS. 4A to 4I illustrate schematic views of a method of manufacturing the solar cell element according to an embodiment of the disclosure.

FIGS. 4A to 4I illustrate schematic views of a method of manufacturing the (BC type) solar cell element 20 according to an embodiment of the disclosure. FIG. 4A illustrates preparation steps of the semiconductor substrate 1. FIG. 4A illustrates preparation of the semiconductor substrate 1, the conductive type of which is a p-type (p-type semiconductor substrate 1).

When a monocrystal silicon substrate is used as the semiconductor substrate 1, the crystal silicon substrate 1 (semiconductor substrate 1) can be obtained by slicing a monocrystal silicon ingot produced by a known production method, such as the float-zoning (FZ) method or Czochralski (CZ) method, into a predetermined thickness. When a polycrystal silicon substrate is used as the semiconductor substrate 1, the semiconductor substrate 1 can be obtained by slicing a polycrystal silicon ingot produced by a known production method, such as a casting or in-mold coagulation method, into a predetermined thickness. When a plate-form silicon obtained by the crystal pulling method such as the ribbon method is used, the semiconductor substrate 1 can be obtained in a desired form by cutting this plate-form silicon into a predetermined size, and optionally subjecting the resultant to surface-polishing treatment or the like.

Hereinafter, the solar cell element 20 manufacturing method will be described in the context of an example. In this example the semiconductor substrate 1 is a crystal silicon substrate the conductive type of which is a p-type (p-type crystal silicon substrate/semiconductor substrate 1), wherein crystal silicon is doped with B or Ga as a dopant element in an amount of about 1E15 to 1E17 atoms/cm$^3$. The doping of the dopant element can be realized by melting, into a silicon melt, the dopant element itself or a dopant material wherein an appropriate amount of the dopant element is contained in silicon in an appropriate amount in each of the above-mentioned silicon ingot producing methods.

In order to remove a mechanical damage layer or a contamination layer which results from the slicing in each of the surface layers (surface layer region) on the front surface side and the rear surface side of the sliced semiconductor substrate 1, the surface layer region is etched. The etching may be done in an area of about 10 μm to about 20 μm, by effect of NaOH, KOH, a mixed liquid composed of hydrofluoric acid and nitric acid, or the like. The resultant is washed with pure water or the like, thereby removing organic components or metal components. Additionally, it is preferred that the resultant is subjected to treatment with diluted hydrofluoric acid plus rinsing treatment with pure water, whereby the surface where a silicon thin layer is to be formed as described below is terminated with hydrogen. In this manner, a heterojunction interface excellent in quality can be more easily formed between the semiconductor substrate 1 and the silicon thin layer.

FIG. 4B illustrates a reverse-conductive-type layer forming step. Next, the n-type silicon thin layer 3, which is a reverse-conductive-type of reverse-conductive-type layer, is formed over a non-light-receiving surface of the semiconductor substrate 1. Specifically, a-Si:H(n) film or μc-Si:H(n) film is formed, as the n-type silicon thin layer 3, over the rear surface side (non-light-receiving surface) of the semiconductor substrate 1.

As described above, it is preferred to form the i-type silicon thin layer 2 (e.g., an a-Si:H(i) film or μc-Si:H(i) film), which is an intrinsic type (i-type) semiconductor layer, on the rear surface side of the semiconductor substrate 1, and then form the n-type silicon thin layer 3, which is a reverse-conductive-type layer, on the i-type silicon thin layer 2 (FIG. 4B).

The method for forming these silicon thin layers such as the i-type silicon thin layer 2 is preferably CVD, in particular, plasma CVD (PECVD), or Cat-CVD. In the case of using, in particular, Cat-PECVD as disclosed in JP-A-2003-173980, a silicon thin layer very high in quality can be formed, so that the quality of the heterojunction formed between the semiconductor substrate 1 and the silicon thin layer is improved. In this manner, high characteristics and a high yield of the solar cell element 20 are more easily realized.

In the case of using Cat-PECVD, silane and hydrogen may be used as gases for the formation of the i-type silicon thin layer 2, and silane, hydrogen and phosphine for adding P as a dopant are used as gases for the formation of the n-type silicon thin layer 3, thereof. Preferred film-forming conditions are as follows: the substrate temperature is from about 100° C. to about 300° C. (for example, about 200° C.), the gas pressure is from about 10 Pa to about 500 Pa, and the electric power density is from about 0.01 W/cm$^2$ to about 1 W/cm$^2$. These conditions make it possible to form a silicon thin layer very high in quality at a relatively lower temperature of about 200° C. in a short time.

FIG. 4C illustrates a conductive layer 7 forming step. Next, the conductive layer 7 is formed over the n-type silicon thin layer 3. It is particularly preferred to form the transparent conductive adhesive layer 5 and the reflective layer 6 on the n-type silicon thin layer 3 and then form the conductive layer 7 thereon.

The transparent conductive adhesive layer 5 may be formed, for example but without limitation, by sputtering, vapor deposition, ion plating, a sol-gel method, a method of spraying and heating raw materials made into a liquid form, and the like. An example of formation of an ITO film as the transparent conductive adhesive layer 5 by sputtering is described below. An ITO target doped with $SnO_2$ in an amount of about 0.5% to about 4% by weight is used to conduct sputtering treatment while argon (Ar) gas or a mixed gas of Ar gas and $O_2$ gas is caused to flow under conditions that the substrate temperature is from about 25° C. to about 250° C. The gas pressure is from about 0.1 Pa to about 1.5 Pa, and the electric power is from about 0.01 kW to about 2 kW.

The reflective layer 6 and the conductive layer 7 can be formed by, for example but without limitation, sputtering, vapor deposition, ion plating or the like. Sputtering is particularly preferred since the heating temperature can be restrained and lowered and the heating period can be made short. An example of the formation an Ag film as the reflective layer 6 and an Al film as the conductive layer 7 by sputtering is as follows. A target of silver and that of aluminum are used, respectively, to conduct sputtering treatment while Ar gas or a mixed gas of Ar gas and $O_2$ gas is caused to flow under conditions that the substrate temperature is from about 25° C. to about 250° C. The gas pressure is from about 0.1 Pa to about 1.5 Pa, and the electric power is from about 0.01 kW to about 2 kW. The conductive layer 7 may be formed by painting an aluminum paste wherein Al powder is incorporated into an organic component into a predetermined pattern by printing or some other painting method, and then firing the resultant.

FIG. 4D illustrates a conductive-layer/semiconductor-substrate electrically connecting step. Next, the contact region 12 is made in one portion of the positive electrode section 16 in order to connect the semiconductor substrate 1 and the second conductive layer 7b electrically to each other in the positive electrode section 16. Specifically, a portion which is the second conductive layer 7b in the conductive layer 7 is heated and melted, thereby making the contact region 12. The contact region 12 penetrates through the silicon thin layer, the transparent conductive adhesive layer 5 and the reflective layer 6 and causes the semiconductor substrate 1 and the second conductive layer 7b to be short-circuited.

FIG. 4E illustrates a laminate separating step. Next, the electrode separators 11 are formed to separate the negative electrode section 15 and the positive electrode section 16 from each other. As mentioned above, the laminate is made up of the i-type silicon thin layer 2, the n-type silicon thin layer 3 (reverse-conductive-type layer), the transparent conductive adhesive layer 5, the reflective layer 6 and the conductive layer 7. One portion of the laminate is removed in the thickness direction of the solar cell element 20 to electrically separate, the positive electrode section 16 (where the contact region 12 is located) from the negative electrode section 15 (where there is no contact region). In this manner, the electrode separators 11 are made in the form of trenches.

The method for making the electrode separators 11 by processing may be, for example and without limitation, a sandblast method, a mechanical scribe method, a laser method or the like. The laser method is particularly preferred since the electrode separators 11 can be precisely and speedily made so as to have a small separation width. Further by using the laser method an electrical damage to a heterojunction region can be restrained and lowered. In the laser method, a known YAG laser machine may be used. The electrode separators 11 can be formed, for example and without limitation, by the radiation of a laser ray having a wavelength of about 0.532 µm, a frequency of about 1 kHz to about 100 kHz, and a pulse width of about 10 nsec to about 50 nsec under conditions that the power is from about 10 to about 50 W and the radiation diameter is from about 10 µm to about 100 µm.

A different example of the formation of the electrode separators 11 is wet etching in the state that a mask is set on the electrodes.

In the laser method, the use of a waterjet-guided laser is preferred since the diameter of a fluid jet is made equal to the processed diameter to give an excellent processing performance. In this manner, it is possible to restrain a deterioration of the film quality of the semiconductor films or a re-diffusion of the dopant in the semiconductor films, which results from heat generated by the laser radiation, so as to restrain a fall in power generating efficiency, and further restrain a matter that ablation wastes resulting from the laser radiation adhere to the periphery of the processed region to cause contamination.

The formation of the electrode separators 11 causes the n-type silicon thin layer 3, the semiconductor substrate 1, and the p+ region 4, which is one portion thereof, to form an n/p/p+ junction between the first conductive layer 7a of the negative electrode section 15 and the second conductive layer 7b of the positive electrode section 16, which are formed on the rear surface side of the semiconductor substrate 1.

FIG. 4F illustrates a texture structure forming step. Next, the texture structure 1a is formed in the front surface side (light-receiving surface) of the semiconductor substrate 1 by etching.

The method for forming the texture structure 1a may be wet etching with an aqueous solution of an alkali such as NaOH or KOH, drying etching using an etching gas capable of etching Si, or the like.

In the case of using the wet etching, the rear surface side of the laminate (on the rear surface side of the semiconductor substrate 1) is preferably masked with an etching inhibiting material in order to prevent an uneven structure from being made in the rear side surface.

In the case of using the drying etching, the fine-irregularity texture structure 1a can be formed in the treating surface (light-receiving surface side). In a case where the BC type solar cell element 20 is made according to the embodiment, a texture structure is formed in the light-receiving surface side of its semiconductor substrate (e.g., semiconductor substrate 1), and the texture structure is irrelevant to any n/p/p+ junction. Accordingly, when the dry etching is used to form the texture structure 1a, a solar cell element better in characteristics can be obtained which is small in the current density of a diode current originating from any n/p/p+ junction (dark current density) and in the current density of a diode current originating from the interface between an n-type layer (n-type silicon thin layer) and a conductive layer 7. This is because the current density of these diode currents is a value proportional to the volume of the junction or the area of the interface, and further the volume and the area are smaller in the case of drying etching, wherein an uneven structure is not formed on the rear surface side, than in the case of wet etching, wherein an uneven structure is formed on the rear surface side also. Therefore, in order to form the texture structure 1a uniformly and satisfactorily so as to decrease the light reflectivity effectively over the entire area of the substrate (e.g., semiconductor substrate 1), it is more preferred to use the dry etching.

Dry etching may be in accordance with various methods. In the case of using, in particular, RIE (Relative Ion Etching), the fine-irregularity texture structure 1a can be formed over a wide area in a short time in such a manner that the reflectivity of light rays over a wide wavelength range can be restrained into a very low value. The RIE method is disclosed in JP-A-2000-332279, relevant content of which is incorporated by reference herein in its entirety. In short, the method is very effective for increasing the efficiency of the solar cell element 20. The method has, in particular, a characteristic that an uneven structure can be formed without being largely affected by the plane direction of the crystal; thus, even when a polycrystal silicon substrate is used as the semiconductor substrate 1, the fine-irregularity texture structure 1a can be uniformly formed to have a low reflectivity over the entire area of the semiconductor substrate 1 in spite of the plane direction of each of crystal grains in the polycrystal silicon substrate (semiconductor substrate 1).

In the case of using RIE, the texture structure 1a can be satisfactorily formed, for example but without limitation, by introducing chorine gas ($Cl_2$), oxygen gas ($O_2$), sulfur hexafluoride gas ($SF_6$), or the like into an etching chamber of a known etching machine to give a blend ratio of about 1/5/5, and conducting etching treatment for about 5 minutes under conditions that the reaction gas pressure is about 7 Pa and the RF power density for giving plasma is about 5 $kW/m^2$. The gas flow rates and other variables depend on the size of the chamber. If necessary, an appropriate amount of methane trifluoride gas ($CHF_3$) or $H_2O$ gas may be further incorporated into the above-mentioned mixed gas.

The formation of the texture structure 1a at this stage is optional. Alternatively, the formation of the texture structure 1a may be performed before the silicon thin layers are formed, or after the contact region 12 is made. In the case of using the wet etching, the texture structure 1a may be formed continuously to the above-mentioned process of removing a damage layer in the surface region of semiconductor substrate 1.

FIG. 4G illustrates a insulating layer 10 forming step. Next, preferably, the insulating layer 10 is formed. As illustrated in FIG. 4G, the insulating layer 10 is formed to cover the conductive layer 7 and the electrode separators 11, except partial regions for keeping electric connection to the first and second electrodes 13 and 14. Specifically, an oxide film (insulating layer 10) such as a $SiO_2$ film or $TiO_2$ film or a nitride film such as a $Si_3N_4$ film is formed into a thickness of about 10 nm to about 1000 nm by sputtering, vapor deposition, CVD or the like.

FIG. 4H illustrates a power-leading-out electrode forming step. Next, the first electrode 13 and the second electrode 14 are formed. The first and second electrodes 13 and 14 are preferably electrodes higher in solder wettability than the conductive layer 7; in this case, the solder-based connectivity thereof to a wiring member 21, described below, can be improved. However, when the conductive layer 7 is already formed by use of a metal paste, the formation of the first and second electrodes 13 and 14 may be omitted.

These power-leading-out electrodes are formed by forming electrode patterns made of a metal paste wherein metal powder and an organic component are mixed with each other in a painting manner such as printing, and then firing the resultant. In order to prevent damage to the silicon thin layers, a binder made of a resin curable near about 200° C. is used in the metal paste. The resin binder may be one or more selected from, for example but without limitation, epoxy resin, phenol resin, urethane resin and polyester resin, and the like. The period for the firing may be about 1 hour.

FIG. 4I illustrates a passivation layer 8 and antireflective layer 9 forming step. Next, the passivation layer 8 and the antireflective layer 9 are formed on the light-receiving surface side of the semiconductor substrate 1.

The passivation layer 8 may be formed in the same way as the insulating layer 10. If necessary, the surface on which the passivation layer 8 is to be formed may be treated with cleaning gas. The layer-forming surface can be appropriately cleaned, for example, by subjecting the surface to microetching treatment with plasma of a gas such as $CF_4$ or $SF_6$ gas.

The antireflective layer 9 can be formed by, for example and without limitation, PECVD, vapor deposition, sputtering or the like. When the antireflective layer 9 is formed, the temperature for the layer-formation is set to about 400° C. or lower, preferably about 300° C. or lower.

If necessary, solder regions may be further formed on the first and second electrodes 13 and 14 by solder dip treatment (not illustrated). The solar cell element 20 is manufactured through the above-mentioned steps.

This manufacturing method comprises the step of forming, over a front surface or a rear surface of the semiconductor substrate 1 the conductive type of which is a p-type, a silicon thin layer the conductive type of which is an n-type (n-type silicon thin layer 3), forming a conductive layer 7 over the n-type silicon thin layer 3, and then heating and melting the conductive layer 7. According to this method, a pn junction between the semiconductor substrate 1 and the n-type silicon thin layer 3 in its negative electrode section 15 is maintained while in its positive electrode section 16 the formation of a p+ region 4 into the semiconductor substrate 1 and electric connection, based on the formation of a contact region 12, between the conductive layer 7 and the p+ region 4 (in the semiconductor substrate 1) are simultaneously realized. Therefore, a solar cell element 20 (a BC type solar cell element 20) can be manufactured without conducting complicated treatment steps, such as a removing step based on etching and the step of re-growing a p-type silicon thin layer.

Additionally, by use of cat-PECVD or a similar thin-film-forming method to form the silicon thin layer, a pn junction very high in quality is formed between the (p-type) semiconductor substrate 1 and the n-type silicon thin layer 3 at a very lower temperature of about 200° C., and further a good contact is attained between the (p-type) semiconductor substrate 1 (specifically, the p+ region 4) and the conductive layers such as the conductive layer 7 through the contact region 12. As a result, the BC type solar cell element 20 having high conversion efficiency is realized.

Figure 7:
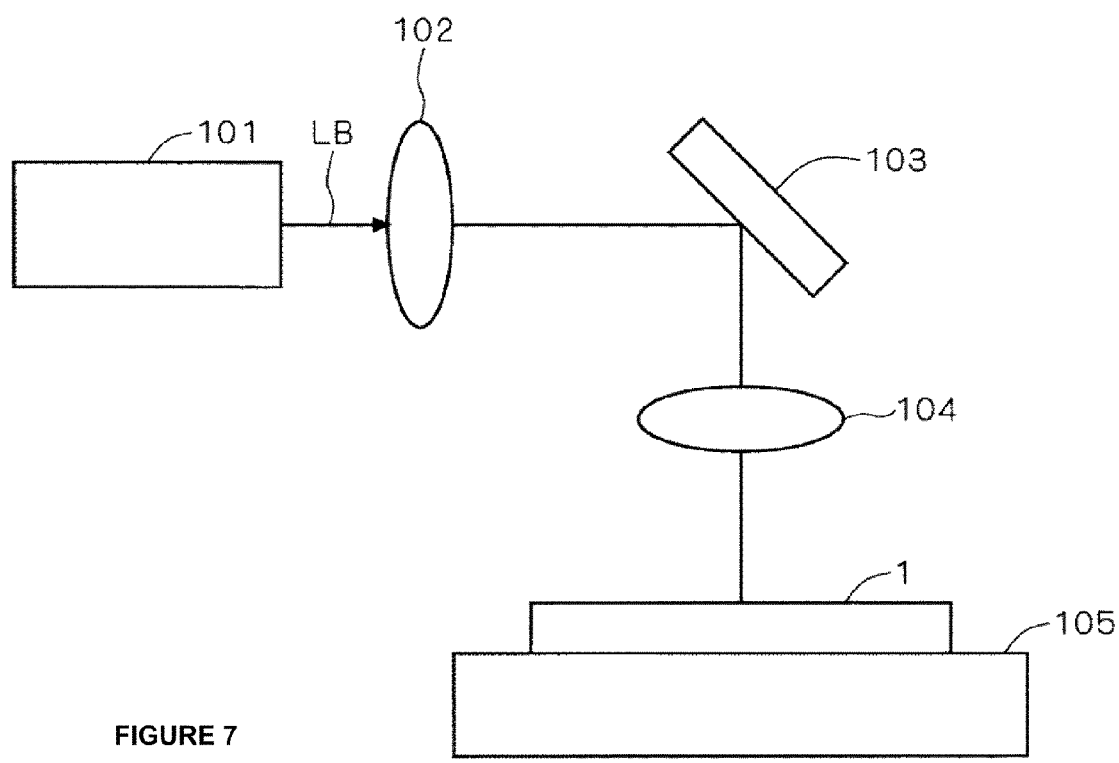
FIG. 7 illustrates a schematic view of an exemplary structure of a laser processing machine which can be used for laser-radiation for heating and melting a conductive layer according to an embodiment of the disclosure.

FIG. 7 illustrates a schematic view of an exemplary structure of a laser processing machine 100 which can be used for laser-radiation for heating and melting a conductive layer 7 according to an embodiment of the disclosure. The heating and melting are preferably conducted by the radiation of a laser ray. FIG. 7 is a schematic view that schematically illustrates the structure of a laser processing machine 100 that can be used in the laser radiation.

When the laser processing machine 100 is used to conduct the heating and melting, the semiconductor substrate 1 which has undergone the steps up to the formation of the conductive layer 7 is first put onto a table 105 in the state that the rear surface side thereof is directed toward a radiation source of a laser ray LB in advance. In this state, the laser ray LB is generated in a laser ray generator (light source) 101, and then radiated into a first optical system 102 containing mirrors and lenses not illustrated. The laser ray LB is adjusted into a desired shape by the first optical system 102. The laser ray LB that has passed through the first optical system 102 is reflected on a reflecting mirror 103, and then radiated into a second optical system 104. The laser ray LB the focus of which is adjusted by the second optical system 104 is radiated to positions where the contact region 12 is to be made in the semiconductor substrate 1 put on the table 105.

When the laser processing machine 100 is a known YAG laser machine, for example, a pulse laser ray having a wavelength of about 1.064 μm and a pulse width of about 2 nsec is radiated at a power density of about 0.05 J per pulse to give a radiation diameter of about 140 μm, thereby making it possible to form a structure wherein the conductive layer 7 and the crystal silicon substrate (semiconductor substrate 1) are short-circuited through the contact region 12. A pulse laser ray having a wavelength of about 1.064 μm and a pulse width of about 125 nsec is radiated at a power density of about 0.001 J per pulse to give a radiation diameter of about 40 μm. By adjusting a combination of the pulse frequency and the scanning speed appropriately, laser processed spots can be formed in a dot form at intervals of about 100 μm to about 1 mm or can be formed in a linear form.

Figure 8:
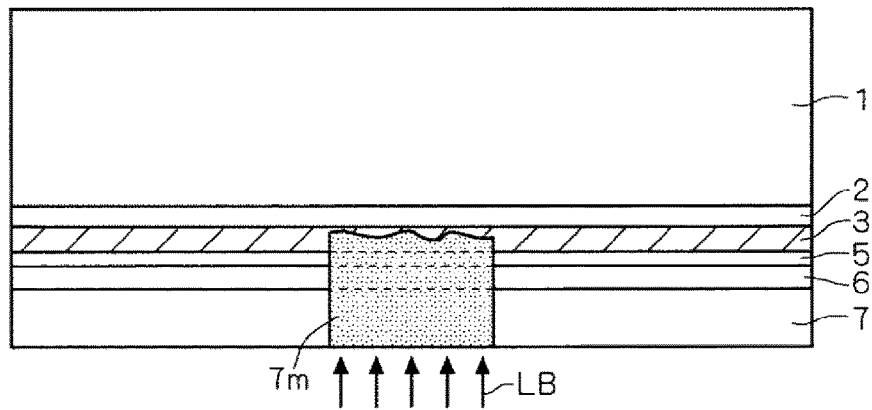
FIGS. 8A-8C illustrate schematic views of an exemplary state change near the conductive layer when the laser processing machine is used to heat and melt the conductive layer according to an embodiment of the disclosure.
Figure 8:
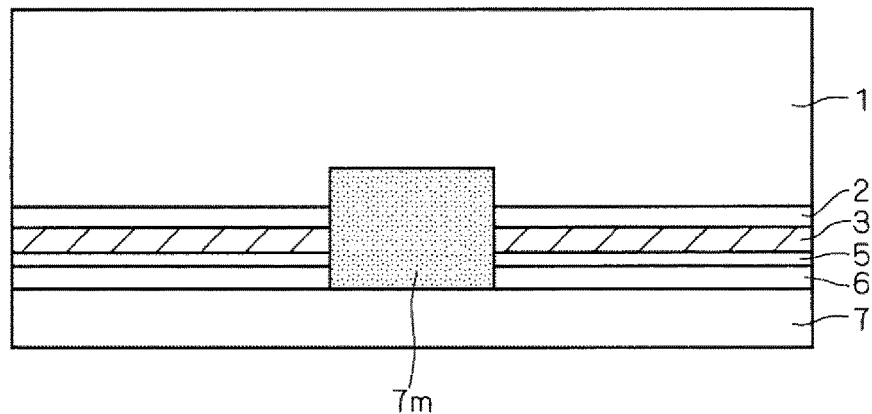
Figure 8:
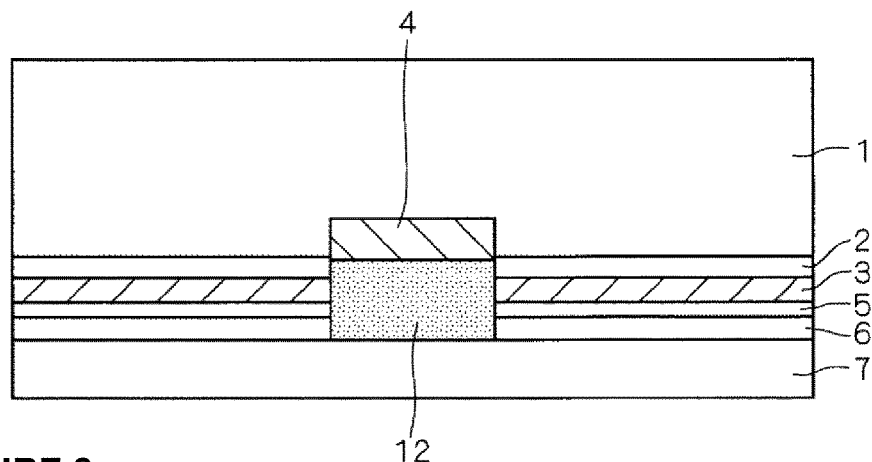

FIGS. 8A-8C illustrate schematic views of an exemplary state change near the conductive layer 7 when the laser processing machine 100 is used to heat and melt the conductive layer 7 according to an embodiment of the disclosure. FIGS. 8A to 8C are views that schematically illustrate a change of the state near the portion of the conductive layer 7 which is the second conductive layer 7b when the laser processing machine 100 is used to heat and melt the portion. When the laser ray LB is radiated to the portion to be the second conductive layer 7b, which is also a local region where the contact region 12 is formed, so as to melt Al constituting the conductive layer 7 as illustrated in FIG. 8A, the reflective layer 6, the transparent conductive adhesive layer 5, the n-type silicon thin layer 3 and the i-type silicon thin layer 2, which are very thinly formed, are successively and easily eroded by melted Al 7 m. Furthermore, as illustrated in FIG. 8B, the melted Al 7 m erodes a partial region of the semiconductor substrate 1 to melt silicon (Si) constituting the semiconductor substrate 1 into the melted Al.

Thereafter, the radiation of the laser ray is ended to cool and solidify the melted Al 7 m. Next, Si melted in the melted Al 7 m precipitates (grows epitaxially) again as a crystal phase on the semiconductor substrate 1 as an underlying substance. The precipitation is generated substantially correspondingly to the two-component system phase diagram of Si—Al as far as the amount of the melted Al 7 m is sufficient (ex. 1E18 atom/cm$^3$ or more) and the amount of impurities originating from the reflective layer 6, the transparent conductive adhesive layer 5, the i-type silicon thin layer 2, and the n-type silicon thin layer 3 is an ignorable amount (ex. 1E17 atom/cm$^3$ or less).

As illustrated in FIG. 8C, the precipitation results in the formation of the contact region 12 made mainly of Al and the formation of the p+ region 4 wherein Al is contained in an amount of about 1E18 to 5E18 atoms/cm$^3$ in Si. In other words, Al, which is an element constituting the second conductive layer 7b and the contact region 12, diffuses into one portion of the semiconductor substrate 1 made of Si, whereby the portion becomes a diffusion region (p+ region 4).

As described above, the thickness of the conductive layer 7 is from about 100 to about 5000 nm, and is usually substantially larger than the total thickness of the reflective layer 6, the transparent conductive adhesive layer 5, the i-type silicon thin layer 2 and the n-type silicon thin layer 3 (the thicknesses of these layers are exaggerated in FIGS. 1 and 4A to 4I); therefore, it should be noted that the thickness of the conductive layer 7 itself, after the melted Al 7 m is cooled and solidified, is substantially the same as before the layer 7 is heated and melted.

As described above, a laminate is formed by forming, over a front surface side or a rear surface side of a one-conductive-type semiconductor substrate, a reverse-conductive-type layer, the conductive type of which is reverse to that of the one-conductive-type semiconductor substrate, and further forming the conductive layer 7 over the reverse-conductive-type layer (or a laminate wherein another layer is inserted into the above-mentioned laminate), the conductive layer 7 is heated and melted, thereby making it possible to connect the conductive layer 7 and the semiconductor substrate 1 electrically to each other. This means that while a reverse-conductive-type layer is once laminated and formed over a front surface side or a rear surface side of the one-conductive-type semiconductor substrate, a region different in conductive type from the reverse-conductive-type layer can be further formed without removing the reverse-conductive-type layer by etching.

Solar Cell Module, and Manufacturing Method Thereof

Figure 3:
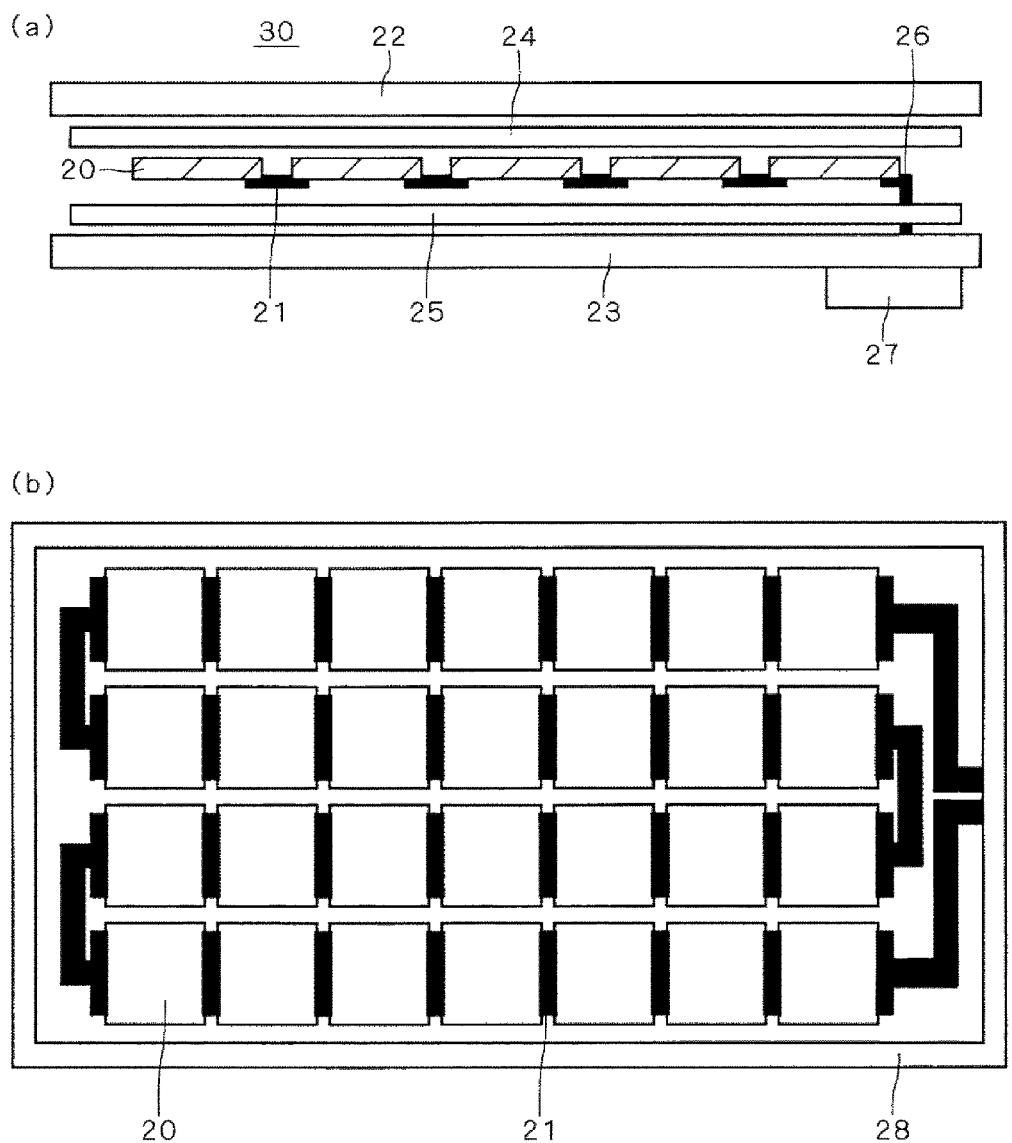
FIG. 3A illustrates a schematic sectional view of an exemplary structure of a solar cell module made by use of the solar cell element according to an embodiment of the disclosure.
FIG. 3B illustrates a schematic front surface (light-receiving surface) side view of the solar cell module made by use of the solar cell element according to an embodiment of the disclosure.

FIGS. 3A and 3B illustrates a solar cell module 30 comprising a plurality of solar cell elements each having a structure as described above, and a manufacturing method thereof. FIG. 3A illustrates a schematic sectional view of an exemplary structure of the solar cell module 30 made by use of the solar cell element 20 according to an embodiment of the disclosure. FIG. 3B illustrates a schematic front surface side (light-receiving surface) view of the solar cell module 30 made by use of the solar cell element 20 according to an embodiment of the disclosure.

When the electric power of a single solar cell element is small, each of a plurality of the solar cells are connected to each other in series or in parallel, thereby constructing a solar cell module 30. By combining a plurality of the solar cell modules (e.g., solar cell module 30) with each other, practical electric power can be produced.

As illustrated in FIG. 3A, the solar cell module 30 is mainly equipped with a transparent member 22 made of glass or the like, a front surface side filler 24 made of transparent ethylene/vinyl acetate copolymer (EVA), solar cell elements 20 as described below, a rear surface side filler 25 made of EVA or the like, and a rear surface protective member 23 wherein a piece of polyethylene terephthalate (PET) or metal foil is sandwiched between pieces of polyvinyl fluoride resin (PVF). In the solar cell elements 20, along the direction in which the solar cell elements 20 adjoin each other, their first electrode 13 and the second electrode 14 are alternately connected to each other through the wiring member 21.

The solar cell module 30 is obtained by laminating, over the transparent member 22, the front surface side filler 24, a plurality of the solar cell elements such as the solar cell element 20 and the wiring member 21 therefore, the rear surface side filler 25 and the rear surface protective member 23 successively to yield a module base body, and then pressing the module base body in a laminator while the module base body is degassed and heated, thereby integrating the individual members with each other.

The wiring member 21 for connecting any adjacent solar cell elements 20 to each other is usually a product wherein whole surfaces of a copper foil piece having a thickness of about 0.1 to 0.2 mm and a width of 2 mm are covered with solder material. The product is cut into a predetermined length and then soldered onto the electrodes of the solar cell elements 20 forming the wiring member 21, and thereby connecting the solar cell elements 20 to each other.

The solar cell elements 20 are connected to each other in series. A terminal of one of the electrodes of a first solar cell element 20 and a terminal of one of the electrodes of a last solar cell element 20 of the series form output leads. These terminals are connected to a terminal box 27 of a power output section through power output wires 26. As illustrated in FIG. 3B, a frame 28 made of aluminum or the like is optionally fitted to the circumference of the solar cell module 30, the illustration of which is not given in FIG. 3A.

As described above, the solar cell module 30 can be produced using the solar cell elements 20, which have high conversion efficiency. Therefore, the solar cell module 30 can be formed as a photoelectric conversion element and a photoelectric conversion module low in cost and high in efficiency.

MODIFIED EXAMPLES

In the above-mentioned embodiment, the n-type silicon thin layer 3 is formed over the rear surface side of the semiconductor substrate 1, thereby realizing a solar cell element 20 comprising a heterojunction between the semiconductor substrate 1 and its reverse-conductive-type layer. Alternatively, the reverse-conductive-type layer may be formed by diffusing a dopant element thermally into the rear surface side (region) of the semiconductor substrate 1. In this case also, the individual steps may be performed subsequent to the formation of the conductive layer 7 in the same way as described above.

In the above-mentioned embodiment, a (p-type) semiconductor substrate 1 is used. Alternatively, according to this embodiment, an (n-type) semiconductor substrate 1 may be used. In this case, the polarity of each of the layers described above is reversed, thereby yielding a solar cell element which produces the same effects and advantages through the same steps as described in the above-mentioned embodiment. In this embodiment, the conductive layer 7 is formed, using a metal which does not behave as a p-type doping element in an n-type semiconductor substrate, for example and without the limitation, titanium (Ti), and the like.

In the above-mentioned embodiment, a solar cell element 20 was used as an example. However, this embodiment is not limited thereto, and can be generally applied to any photoelectric conversion element that contains crystal silicon substrate comprising a light-incident surface and has a pn junction region wherein photogenerated carriers generated in the pn junction region by the radiation of light to the light-incident surface are collected as an electric current (for example, an optical sensor).

An exemplary semiconductor substrate 1 made from a monocrystal or polycrystal silicon material was described in the above-mentioned embodiment. Alternatively, according to another embodiment describe hereinafter (this embodiment), the material may be, for example and without limitation, gallium arsenide (GaAs).

Furthermore, the order of the individual steps for manufacturing the solar cell element 20 is not limited to the order described in the above-mentioned embodiment. FIG. 5, FIGS. 9A and 9B, and FIGS. 10A and 10B show examples where the solar cell element 20 is manufactured in different order than that explained in the above-embodiment.

Figure 5:
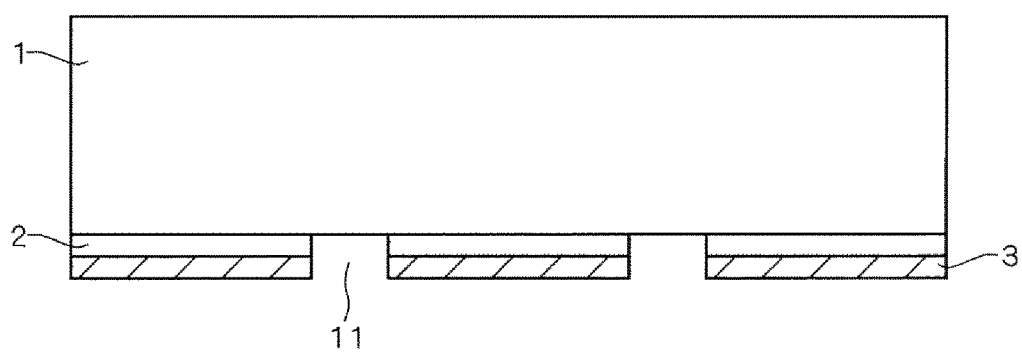
FIG. 5 illustrates a view of an exemplary location of the solar cell element manufactured according to an embodiment of the disclosure.

FIG. 5 illustrates a view of an exemplary location of a solar cell element manufactured according to an embodiment of the disclosure. Firstly, as illustrated in FIG. 5, a plurality of areas of the i-type silicon thin layer 2 and a plurality of areas of the n-type silicon thin layer 3 may be formed in such a manner that the negative electrode section 15 and the positive electrode section 16 are beforehand separated from each other by means of the electrode separators 11. Such a structure may be formed by masking areas where the electrode separators 11 are to be formed when the i-type silicon thin layer 2 and n-type silicon thin layer 3 are each formed, or by forming a silicon thin layer as each of the i-type silicon thin layer 2 and n-type silicon thin layer 3 all over without using any mask and then removing areas where the electrode separators 11 are to be formed by an etching or laser method. In addition, the transparent conductive adhesive layer 5, the reflective layer 6 and the conductive layer 7 are formed in each of the negative electrode section 15 and the positive electrode section 16, and then a predetermined layer of the conductive layer 7 is heated and melted to attain the electric connection. In this manner, it is possible to realize a state equivalent to the state that the laminate is separated in the above-mentioned embodiment (FIG. 4E). Thereafter, by performing the same subsequent steps as in the above-mentioned embodiment, the same effects and advantages can be produced.

Figure 9:
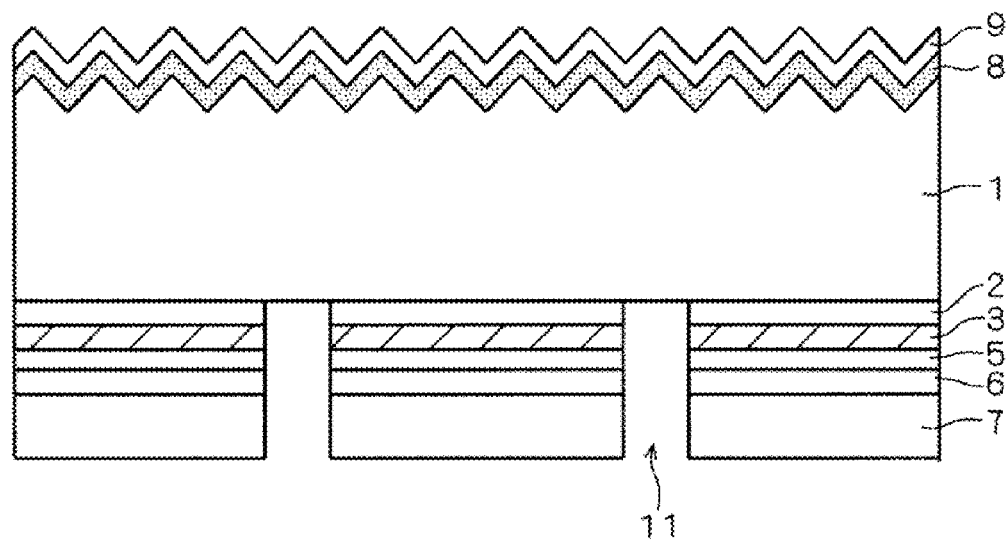
FIGS. 9A and 9B illustrate views of an exemplary solar cell element manufactured according to an embodiment of the disclosure.
Figure 9:
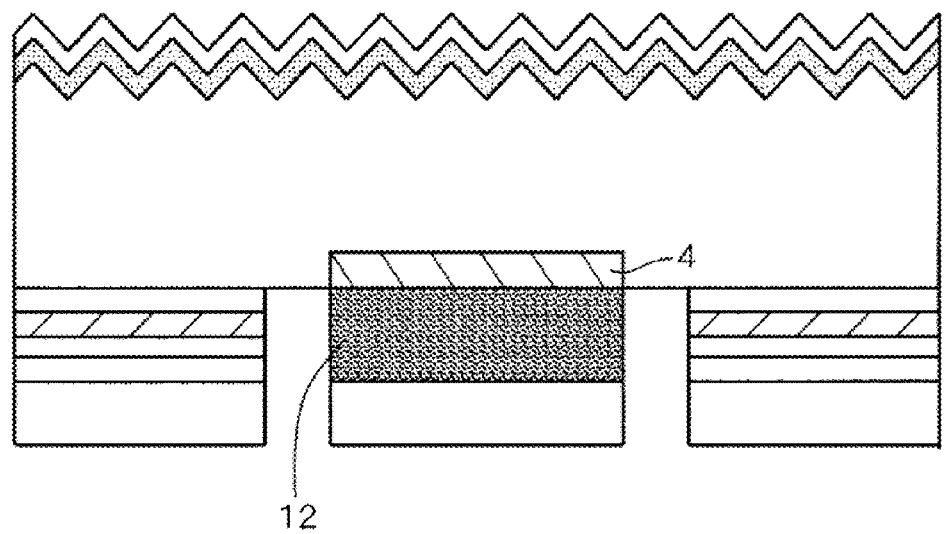

FIGS. 9A and 9B illustrate views of an exemplary solar cell element 20 manufactured according to an embodiment of the disclosure. FIGS. 9A and 9B illustrate a step of forming a laminate made up of the i-type silicon thin layer 2, the n-type silicon thin layer 3 and the conductive layer 7, removing the laminate partially in the thickness direction thereof (forming the electrode separators 11), thereby separating the laminate to a plurality of laminates (FIG. 9A), and then heating and melting the conductive layer 7 that constitutes the partial laminate positioned at the center, thereby attaining the electric connection (FIG. 9B). When this step is adopted, any silicon thin layer is restrained from being present in the positive electrode section 16. It is therefore possible to restrain a matter that a heterojunction remaining partially, after the formation of the contact region 12, between the n-type silicon thin layer 3 and the semiconductor substrate 1 functions as a reverse junction to lower characteristics of the solar cell element 20.

Figure 10:
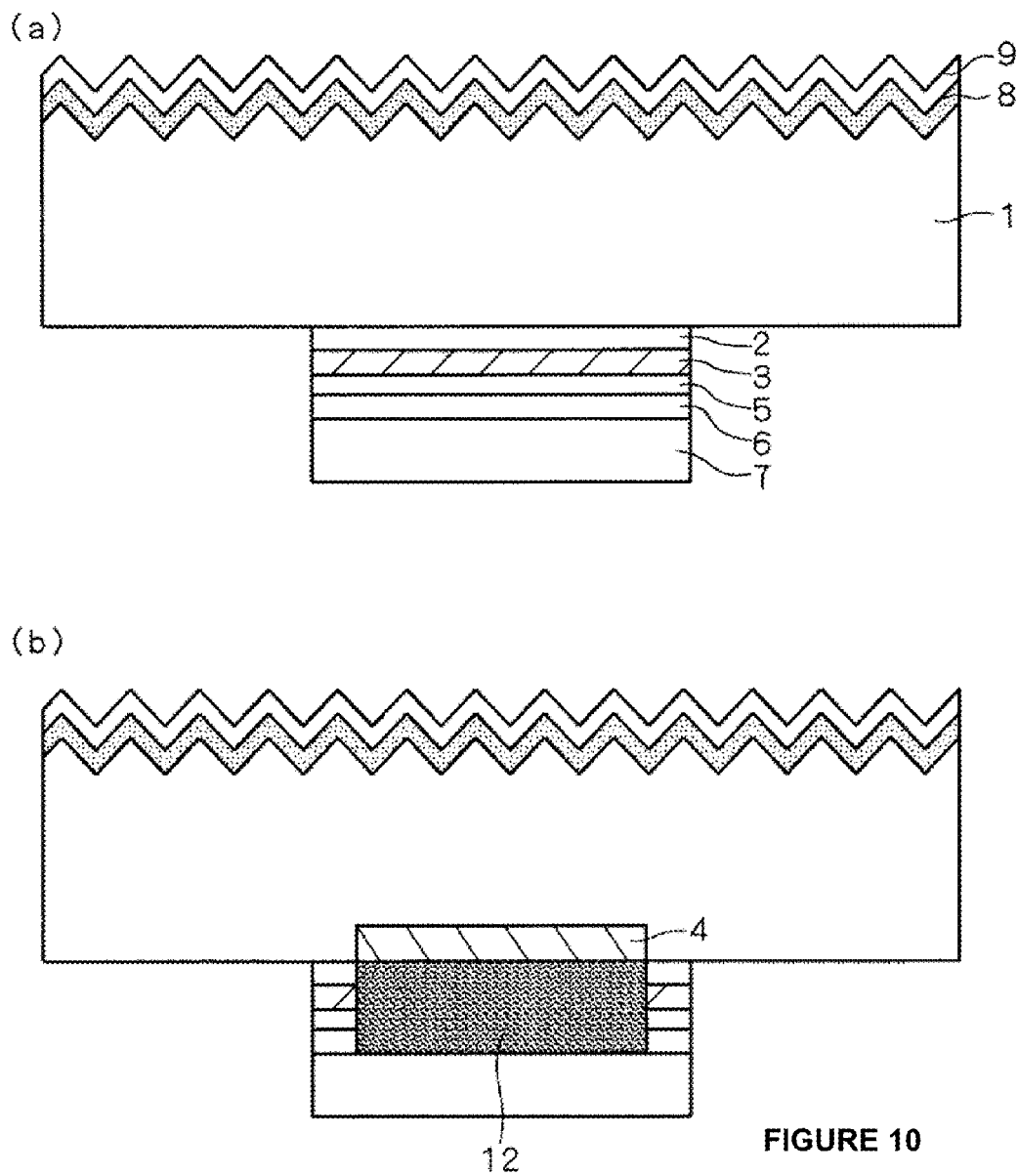
FIGS. 10A and 10B illustrate views of an exemplary solar cell element manufactured according to an embodiment of the disclosure.

FIGS. 10A and 10B illustrate views of an exemplary solar cell element 20 manufactured according to an embodiment of the disclosure. FIGS. 10A and 10B illustrate a step of forming the i-type silicon thin layer 2 and the n-type silicon thin layer 3 partially on the rear surface side of the semiconductor substrate 1 (FIG. 10A), and then heating and melting the conductive layer 7 to attain the electric connection (FIG. 10B). In this manner, the reverse-conductive-type layer may be formed partially on the rear surface side of the semiconductor substrate 1.

As illustrated in FIGS. 9A and 9B and FIGS. 10A and 10B, after the formation of the texture structure 1a, the passivation layer 8 and the antireflective layer 9 on the front surface side (light-receiving surface side) of the semiconductor substrate 1, the individual layers may be formed on the rear surface side (non-light-receiving surface side) of the semiconductor substrate 1.

The examples illustrated in FIG. 5, FIGS. 9A and 9B and FIGS. 10A and 10B are each used in the above-mentioned embodiment in the step in which a laminate is formed by forming, over a front surface or a rear surface of a one-conductive-type semiconductor substrate (semiconductor substrate 1), a reverse-conductive-type layer of a conductive type reverse to that of the semiconductor substrate 1, and further forming a conductive layer 7 on the reverse-conductive-type layer, the conductive layer 7 is heated and melted, thereby connecting the conductive layer 7 and the semiconductor substrate 1 electrically to each other.

Furthermore, in the above-mentioned embodiment, an example is described wherein the heated and melted conductive layer 7 (Al layer) erodes the members extending from the reverse-conductive-type layer to the semiconductor substrate 1, thereby forming the p+ region 4. Alternatively, the p+ region 4 may be formed prior to formation of the heterojunction based on the lamination and formation of the i-type silicon thin layer 2 and the n-type silicon thin layer 3. Specifically, a thick film made of an Al paste into several micrometers to several tens of micrometers on a predetermined area of the semiconductor substrate 1 can be formed. This thick film is formed by printing or the like, treating the resultant thermally at a temperature of not lower than about 577° C. (i.e., Si—Al eutectic temperature to form the p+ region 4 in one portion of the semiconductor substrate 1), and then laminating the i-type silicon thin layer 2 and the n-type silicon thin layer 3 thereon. According to this embodiment, the thickness of the p+ region 4 can be made larger (e.g., several micrometers to several tens of micrometers) than the above-mentioned embodiment. As a result, the BSF effect is further exhibited so that characteristics of the solar cell element 20 are made better. It is preferred to remove Al-including components remaining on the surface of the semiconductor substrate 1 with hydrochloric acid or the like after the thermal treatment, and then use a known surface-washing technique such as RCA technique to remove metal components or organic components from the surface. In the case of the formation of the p+ region 4 in the present embodiment, the contact region 12 by is formed similar to the above-mentioned embodiment by heating and melting in a subsequent step. In this manner, it is possible to realize a good contact between the semiconductor substrate 1 (p+ region 4 of the semiconductor substrate 1) and the second conductive layer 7b.

In the above-mentioned embodiment, the following method was described: the method in which a laminate is formed by forming, over a front surface or a rear surface of the one-conductive-type semiconductor substrate (semiconductor substrate 1), a reverse-conductive-type layer of a conductive type reverse to that of the semiconductor substrate 1, and further forming a conductive layer 7 on the reverse-conductive-type layer, the conductive layer 7 is heated and melted, thereby connecting the conductive layer 7 and the semiconductor substrate 1 electrically to each other. However, this method does not depend on the manner in which the reverse-conductive-type layer on the semiconductor substrate 1, and the conductive layer 7 thereon are formed. More specifically, on the degree that the semiconductor substrate 1 is covered with the reverse-conductive-type layer and the conductive layer 7. In other words, this method may comprise various methods of heating and melting of at least one portion of the laminate made up of the reverse-conductive-type layer and the conductive layer 7 which are formed on at least one area of the semiconductor substrate 1, thereby connecting the conductive layer 7 and the semiconductor substrate 1 electrically to each other.

EXAMPLES

Examples 1 to 7 are examples of the solar cell element according to the above-mentioned embodiment.

In each of Examples 1 to 7, a monocrystal silicon substrate produced by the FZ method was used as the semiconductor substrate 1. The substrate was doped with B (boron) as a dopant, thereby making the monocrystal silicon substrate into a p conductive type. The specific resistivity of the semiconductor substrate 1 was about 2 Ωcm. The thickness of the substrate was set to about 200 μm.

Solar cell elements (e.g., solar cell elements 20) according to Examples 1 to 4 were manufactured, through the steps illustrated in FIGS. 4A to 4I. However, these cell elements were manufactured to have different element-structures wherein optional constituting elements were slightly different from each other.

Specifically, the solar cell elements comprised the semiconductor substrate 1, the i-type silicon thin layer 2, the n-type silicon thin layer 3, the p+ region 4, the transparent conductive adhesive layer 5 (TCO film), the conductive layer 7, the antireflective layer 9, the insulating layer 10, and the contact region 12.

The solar cell element 20 manufactured in Example 1 had the common constituting elements and did not have the texture structure 1a. The solar cell element 20 manufactured in Example 2 had the common constituting elements and further had the texture structure 1a. The solar cell element 20 manufactured in Example 3 had the passivation layer 8 besides the constituting elements of the solar cell element 20 of Example 2. The solar cell element 20 manufactured in Example 4 had the reflective layer 6 in addition to the constituting elements of the solar cell element of Example 3.

The solar cell elements of Examples 5 to 7 were each the same as the solar cell element 20 of Example 4 in their element structures. However, the solar cell elements were manufactured differently from each other.

In each of Examples 1 to 7, the i-type silicon thin layer 2 and the n-type silicon thin layer 3 were first formed on the rear surface side of the monocrystal silicon substrate as the semiconductor substrate 1. Specifically, Cat-PECVD was used to form an i-type hydrogenated amorphous silicon (a-Si:H(i)) layer as the i-type silicon thin layer 2 into a thickness of about 2 nm on the rear surface side (non-light-receiving surface) of the semiconductor substrate 1, and then form an n-type hydrogenated amorphous silicon (a-Si:H(n)) layer as the n-type silicon thin layer 3 into a thickness of about 5 nm. The formation of the a-Si:H(i) layer was attained, using silane and hydrogen as layer-forming gases under conditions that the gas pressure in the chamber was about 200 Pa, the RF power was about 20 W and the substrate temperature was about 200° C. The formation of the a-Si:H(n) layer was attained, using the layer-forming gases to which phosphine was added under conditions that the gas pressure in the chamber was about 200 Pa, the RF power was about 20 W and the substrate temperature was about 200° C.

However, in Example 5, a thick film made of an aluminum paste was formed in a predetermined area (area where the p+ region 4 was formed) of the positive electrode section 16 by printing, and then the resultant was fired to form the p+ region 4 beforehand. In addition, the i-type silicon thin layer 2 and the n-type silicon thin layer 3 were formed thereon.

In Examples 1 to 3, a sputtering machine was used to form, on the silicon thin layers formed as described above, an ITO film as the transparent conductive adhesive layer 5 (TCO film) into a thickness of about 5 nm, and then form an Al layer as the conductive layer 7 into a thickness of about 1000 nm thereon. In Examples 4 to 7, a sputtering machine was used to form, on the silicon thin layers formed, an ITO film as the transparent conductive adhesive layer 5 (TCO film) into a thickness of about 5 nm, form an Ag film as the reflective layer 6 into a thickness of about 5 nm thereon, and then form an Al layer as the conductive layer 7 into a thickness of about 1000 nm thereon. In Example 6, the silicon thin layer in a region that was to be the electrode separators 11 was removed before the formation of the ITO film. In Example 7, the silicon thin layers, the ITO film and the Ag film in regions that were to be the electrode separators 11 were removed before the formation of the Al layer.

In each of the Examples, after the Al layer as the conductive layer 7 was formed as described above, a YAG laser machine was used to radiate a laser ray to a predetermined area of the Al layer that was to be an area where the contact region 12 was made, thereby heating and melting the area to make the contact region 12 and the p+ region 4. The radiation of the laser ray was attained under conditions that the wavelength was about 1.064 μm, the pulse width was about 125 nsec, the energy per pulse was about 0.001 J and the radiation diameter was about 40 μm. Subsequently, in Examples 1 to 5, the YAG laser machine was used to radiate a laser ray thereto so as to form the electrode separators 11 for separating the positive electrode section 16 and the negative electrode section 15. The radiation of the laser ray was attained under conditions that the wavelength was about 0.532 μm, the frequency was about 50 kHz, and the pulse width was about 15 nsec, the power was about 10 W and the radiation diameter was about 15 μm.

After the formation of the contact region 12, a SiO2 film as the insulating layer 10 was formed into a thickness of about 100 nm on the negative electrode section 15 and the positive electrode section 16.

Thereafter, in Example 1, without making the texture (uneven texture) structure 1a in the surface on the light-receiving surface side of the monocrystal silicon substrate, an ITO film as the antireflective layer 9 was formed into a thickness of about 80 nm on the surface, which was kept in a flat structure state. In Example 2, the texture (uneven texture) structure 1a was made in the surface by an RIE method, and then an ITO film as the antireflective layer 9 was formed into a thickness of 80 nm thereon. In the texture (uneven texture) structure 1a, irregularities were formed to have a height of about 1 μm and a width of about 1 μm. In each of Examples 3 to 7, the texture (uneven) structure 1a was made in the surface by the same RIE method as in Example 2, and an i-type a-Si:H film as the passivation layer 8 was formed into a thickness of about 2 nm thereon. Furthermore, an ITO film as the antireflective layer 9 was formed into a thickness of 80 nm thereon.

FIGS. 6A-6K illustrate schematic views of exemplary manufacturing steps of a BC type solar cell element 200 according to an embodiment of the disclosure. A solar cell element according to a comparative example was formed as the BC type solar cell element 200 in accordance with the steps illustrated in FIGS. 6A-6K.

Figure 6:
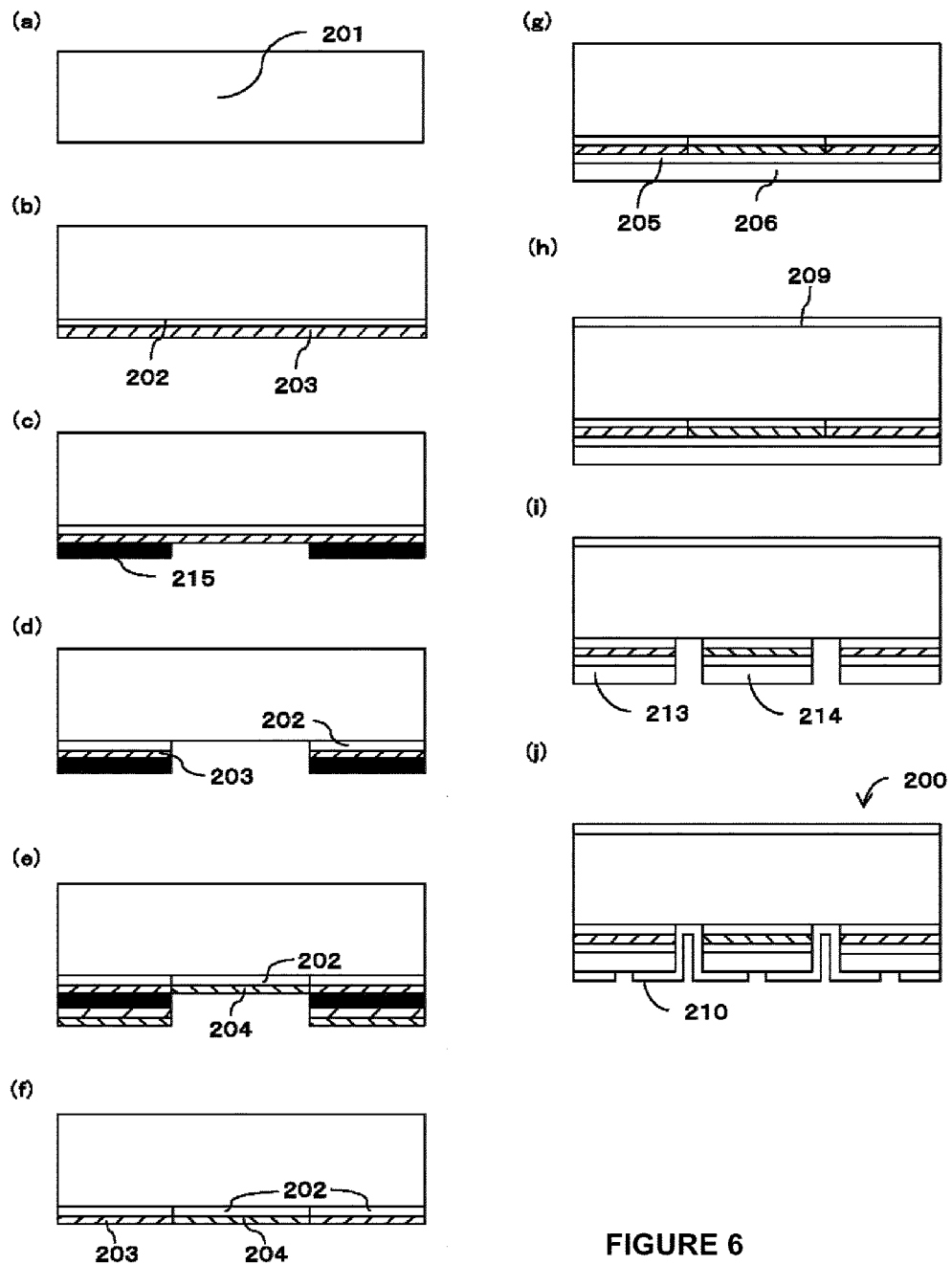
FIGS. 6A-6J illustrate schematic views of exemplary manufacturing steps of a BC type solar cell element according to an embodiment of the disclosure.

Specifically, a monocrystal silicon substrate (p-type silicon substrate) 201 was prepared doped with B wherein its surfaces were micro-etched, thereby cleaning any mechanically damaged layer and any contamination layer in its sliced surfaces (FIG. 6A).

Next, an i-type (non-doped) silicon thin layer 202 and an n-type silicon thin layer 203 were laminated and formed, as a first silicon thin layer, on the rear surface of the p-type silicon substrate 201 (FIG. 6B). Specifically, an i-type hydrogenated amorphous silicon layer as the i-type silicon thin layer 202 and an n-type hydrogenated amorphous silicon layer as the n-type silicon thin layer 203 were successively laminated.

Thereafter, a mask 215 for removing the first silicon thin layer (the i-type silicon thin layer 202 and the n-type silicon thin layer 203) partially was formed (FIG. 6C). The first silicon thin layer present in the opening in the mask 215 was removed by wet etching and so on (FIG. 6D).

Next, an i-type silicon thin layer 202 and a p-type silicon thin layer 204 were laminated and formed as a second silicon thin layer in the region where the first silicon thin layer was removed (FIG. 6E). Specifically, an i-type hydrogenated amorphous silicon layer as the i-type silicon thin layer 202 and a p-type hydrogenated amorphous silicon layer as the p-type silicon thin layer 204 were successively laminated.

In this manner, the first silicon thin layer including the n-type silicon thin layer 203 and the second silicon thin layer including the p-type silicon thin layer 204 were each made of hydrogenated amorphous silicon, thereby yielding a heterojunction between the p-type silicon substrate 201 and the n-type silicon thin layer 203 and a hetero low-high junction between the p-type silicon substrate 201 and the p-type silicon thin layer 204.

Thereafter, in order to remove the second silicon thin layer (the i-type silicon thin layer 202 and the p-type silicon thin layer 204) laminated also on the mask 215, the mask 215 was removed (FIG. 6F).

Next, an oxide transparent conductive material layer 205 and an Al layer 206 made mainly of Al (aluminum) were continuously formed on the first silicon thin layer and the second silicon thin layer to form a rear surface electrode layer that were to be a negative electrode 213 and a positive electrode 214 later (FIG. 6G).

An ITO film was formed as an antireflective layer 209 on the light-receiving surface side (front surfaced side) of the p-type silicon substrate 201 (FIG. 6H).

Next, the contact between the first silicon thin layer and the second silicon thin layer was separated, and further the oxide transparent conductive material layer 205 and the Al layer 206 were separated to the negative electrode 213 and the positive electrode 214 (FIG. 6I).

Lastly, an insulating layer 210 was formed on the rear surface side of the substrate (FIG. 6J), thereby manufacturing a BC type solar cell element 200 for a comparative example.

FIG. 11 illustrates a table of parameters of exemplary solar cell elements manufactured according to an embodiment of the disclosure. FIG. 11 shows the manufacturing method, the structure, and a measurement result of characteristic elements (conversion efficiency and short-circuit current density Jsc) of each of the solar cell elements 20 according to Examples 1 to 7 and the comparative example. The measurement of the characteristic elements was made according to JIS C 8913 (1998) under an AM 1.5 condition. The short-circuit current density Jsc shows a characteristic corresponding to the use efficiency of sunlight. As shown in FIG. 11, the solar cell elements 20 according to Examples 1 to 7 gave conversion efficiencies and short-circuit current densities Jsc equal to or higher than the solar cell element according to the comparative example. Accordingly, by manufacturing a solar cell element 20 having such a form as in the Examples 1-7, specifically, by forming the conductive layer 7 and then making the contact region 12 and the p+ region 4, a solar cell element 20 having characteristics equal to or higher than the BC type solar cell element of the comparative example can be manufactured. In other words, a BC type solar cell element with good characteristics is obtained by use of a manufacturing method as performed in Examples 1-7 even if a complicated process is not performed. The BC type solar cell element, according to various embodiments of the disclosure, is produced by removing a one-conductive-type layer partially by etching, and then forming a different-conductive-type layer again.

A solar cell module 30 was manufactured, using a plurality of the solar cell elements 20 according to Examples 1 to 7, which were high in conversion efficiency. As a result, the solar cell module 30 functions as a photoelectric conversion element and a photoelectric conversion module that are each inexpensive and give a high efficiency.

While at least one exemplary embodiment has been presented in the foregoing detailed description, the present disclosure is not limited to the above-described embodiment or embodiments. Variations may be apparent to those skilled in the art. In carrying out the present disclosure, various modifications, combinations, sub-combinations and alterations may occur in regard to the elements of the above-described embodiments insofar as they are within the technical scope of the present disclosure or the equivalents thereof. The exemplary embodiment or exemplary embodiments are examples, and are not intended to limit the scope, applicability, or configuration of the disclosure in any way. Rather, the foregoing detailed description will provide those skilled in the art with a template for implementing the exemplary embodiment or exemplary embodiments. It should be understood that various changes can be made in the function and arrangement of elements without departing from the scope of the disclosure as set forth in the appended claims and the legal equivalents thereof. Furthermore, although embodiments of the present disclosure have been described with reference to the accompanying drawings, it is to be noted that changes and modifications may be apparent to those skilled in the art. Such changes and modifications are to be understood as being included within the scope of the present disclosure as defined by the claims.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent. The term "about" when referring to a numerical value or range is intended to encompass values resulting from experimental error that can occur when taking measurements.

What is claimed is:

1. A method of manufacturing a solar cell element, comprising:
    forming a reverse conductivity type layer on a semiconductor substrate of one conductivity type;
    forming a conductive layer on the reverse conductivity type layer,
    forming a contact region by heating and melting less than the entire conductive layer such that the contact region electrically connects the conductive layer and the semiconductor substrate; and
    forming a negative electrode and a positive electrode by
        forming an electrode separator adjacent to the contact region by removing a laminate of at least the reverse conductivity type layer and the conductive layer adjacent to the contact region;
        forming an insulating layer that covers the electrode separator and the conductive layer except for a partially exposed region; and
        connecting the positive electrode to the partially exposed region of the conductive layer connected to the contact region and connecting the negative electrode to an adjacent electrically isolated partially exposed region of the conductive layer.

2. The method of manufacturing a solar cell element according to claim 1, wherein:
    forming an electrode separator includes removing at least one part of the laminate so as to separate the laminate into a plurality of partial laminates,
    wherein the contact region is formed by heating and melting the conductive layer comprising at least one of the partial laminates.

3. The method of manufacturing a solar cell element according to claim 2, wherein the at least one part of the laminate is removed by radiating a laser ray to the laminate.

4. The method of manufacturing a solar cell element according to claim 1, further comprising:
    a plurality of reverse conductive type layers formed on the semiconductor substrate; and
    a plurality of conductive layers formed on each of the reverse conductive type layers respectively, wherein the contact region is formed by heating and melting less than the entire conductive layers.

5. The method of manufacturing a solar cell element according to claim 1, wherein less than the entire conductive layer is heated and melted by radiating a laser ray.

6. The method of manufacturing a solar cell element according to claim 1, wherein the reverse conductivity type layer is formed by a CVD method.

7. The method of manufacturing a solar cell element according to claim 1, wherein the conductive layer is formed by sputtering.

8. The method of manufacturing a solar cell element according to claim 1, further comprising:
    forming an intrinsic type semiconductor layer on the semiconductor substrate by a CVD method, and
    forming the reverse conductivity type layer on the intrinsic type semiconductor layer.

9. The method of manufacturing a solar cell element according to claim 1, further comprising:
    forming a transparent conductive adhesive layer on the reverse conductivity type layer; and
    forming the conductive layer on the transparent conductive adhesive layer.

10. The method of manufacturing a solar cell element according to claim 9, further comprising:
    forming a reflective layer on the transparent conductive adhesive layer, wherein the reflective layer comprises mainly Ag; and
    forming the conductive layer on the reflective layer; wherein the conductive layer comprises mainly Al.

11. The method of manufacturing a solar cell element according to claim 1, further comprising forming an insulating layer on the semiconductor substrate, wherein at least one part of a surface of the conductive layer is not covered by the insulating layer.

12. The method of manufacturing a solar cell element according to claim 1, wherein the positive electrode is higher in solder wettability than the conductive layer.

13. The method of manufacturing a solar cell element according to claim 1, wherein the negative electrode is higher in solder wettability than the conductive layer.

14. A method of manufacturing a solar cell element, the method comprising:
    forming a first portion including a laminate including a first-type semiconductor layer;
    converting a part of the first portion to a second portion including a second-type semiconductor layer by heating wherein the first-type semiconductor layer and the second-type semiconductor layer are different; and forming a negative electrode in the first portion and a positive electrode in the second portion by forming an electrode separator to separate the first portion and the second portion by removing the laminate of the first portion;

forming an insulating layer that covers the electrode separator and the first and second portions except for partially exposed regions; and connecting the positive electrode to the partially exposed region of the second portion and connecting the negative electrode to an adjacent electrically isolated partially exposed region of the first portion.

15. The method of manufacturing a solar cell element according to claim 1, wherein forming an electrode separator occurs prior to forming a contact region.

16. The method of manufacturing a solar cell element according to claim 14, wherein forming an electrode separator occurs prior to converting a part of the first portion to a second portion.

* * * * *